(12) United States Patent
Ip et al.

(10) Patent No.: US 7,506,288 B1
(45) Date of Patent: Mar. 17, 2009

(54) INTERACTIVE ANALYSIS AND DEBUGGING OF A CIRCUIT DESIGN DURING FUNCTIONAL VERIFICATION OF THE CIRCUIT DESIGN

(75) Inventors: Chung-Wah Norris Ip, Fremont, CA (US); Mohit Kumar Jain, San Jose, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 284 days.

(21) Appl. No.: 11/092,142

(22) Filed: Mar. 28, 2005

Related U.S. Application Data

(60) Provisional application No. 60/556,782, filed on Mar. 26, 2004.

(51) Int. Cl.
*G06F 17/50* (2006.01)
*G06F 9/45* (2006.01)

(52) U.S. Cl. .................................. 716/5; 716/2; 716/4

(58) Field of Classification Search ................. 716/2, 716/4–5
See application file for complete search history.

(56) References Cited

U.S. PATENT DOCUMENTS

| 6,721,922 | B1 * | 4/2004 | Walters et al. | 716/1 |
| 6,839,884 | B1 * | 1/2005 | Narain et al. | 716/5 |
| 7,065,726 | B1 * | 6/2006 | Singhal et al. | 716/5 |

* cited by examiner

*Primary Examiner*—Jack Chiang
*Assistant Examiner*—Suresh Memula
(74) *Attorney, Agent, or Firm*—Fenwick & West LLP

(57) ABSTRACT

While performing functional verification on a circuit design, a verification tool allows a user to analyze the results of a previous functional analysis. The tool may also receive commands for a next verification analysis while performing a current analysis, and it may allow a user to abort a current analysis. Results from a completed analysis may be discarded or saved for viewing by a user while a next verification is performed on the circuit design. This allows a user to continue to debug and analyze the circuit design without having to wait until previous steps in the verification analysis are completed.

21 Claims, 9 Drawing Sheets

INTERACTIVE ANALYSIS AND DEBUGGING OF A CIRCUIT DESIGN DURING FUNCTIONAL VERIFICATION OF THE CIRCUIT DESIGN

CROSS REFERENCE TO RELATED APPLICATIONS

This application claims the benefit of U.S. Provisional Application No. 60/556,782, filed Mar. 26, 2004, which is incorporated by reference in its entirety.

BACKGROUND

1. Field of the Invention

This invention relates generally to the field of functional verification of digital designs, and in particular to formal verification systems that involve building a formal test bench to rely on user interactivity rather than full automation.

2. Background of the Invention

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

An increasingly popular technique is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid input sequences for a given circuit and is akin to an exhaustive simulation. Formal verification methods are therefore exhaustive, when compared for example to simulation methods, and they may provide many benefits, such as reduced validation time, quicker time-to-market, reduced costs, and high reliability.

Formal verification involves heavy mathematical computation, and traditional formal verification tools place a heavy emphasis on automation. Therefore, users typically let their formal verification tools run in a batch mode instead of interactively, frequently waiting overnight for the complex analysis to finish. But the lack of interactivity leaves the designer's insights into the design out of the process, ultimately making the formal verification less effective. Accordingly, techniques for facilitating interactivity in formal verification are needed.

SUMMARY OF THE INVENTION

A new use model for formal verification improves the practicality of formal verification, allowing for increased interactivity in the formal verification process. The new use model breaks down the generation of a formal proof into multiple steps and allows a user to provide insight about the design between steps through the manual analysis of the intermediate results. The model may also provide visual information to the user, further enabling the user to provide more useful feedback in the resolution process.

In one embodiment, a verification tool receives a set of results from a first functional verification analysis of a circuit design and initiates a second functional verification analysis of the circuit design in a background operation. Because the second analysis is performed in a background operation, the tool can receive user inputs for analyzing the results from the first functional verification while the second functional verification analysis is being performed. This allows a user to continue to debug and analyze the circuit design without having to wait until previous steps in the verification analysis are completed.

In other embodiments, the tool allows the user to abort an analysis that is being performed. This may be desirable if the user decides to change the analysis, for example to tune the analysis or to change the set of commands (including assumptions and/or an analysis region used in the analysis) used to perform the functional analysis on the circuit design. Once the functional analysis is finished, the user may discard the results or may analyze the new results while a next step in the functional analysis of the circuit design is performed in the background.

Accordingly, the tool makes the functional verification process interactive, using a designer's understanding of the circuit design and verification process to guide the functional verification of the circuit design.

DETAILED DESCRIPTION OF THE PREFERRED EMBODIMENTS

Overview

Figure 1A:
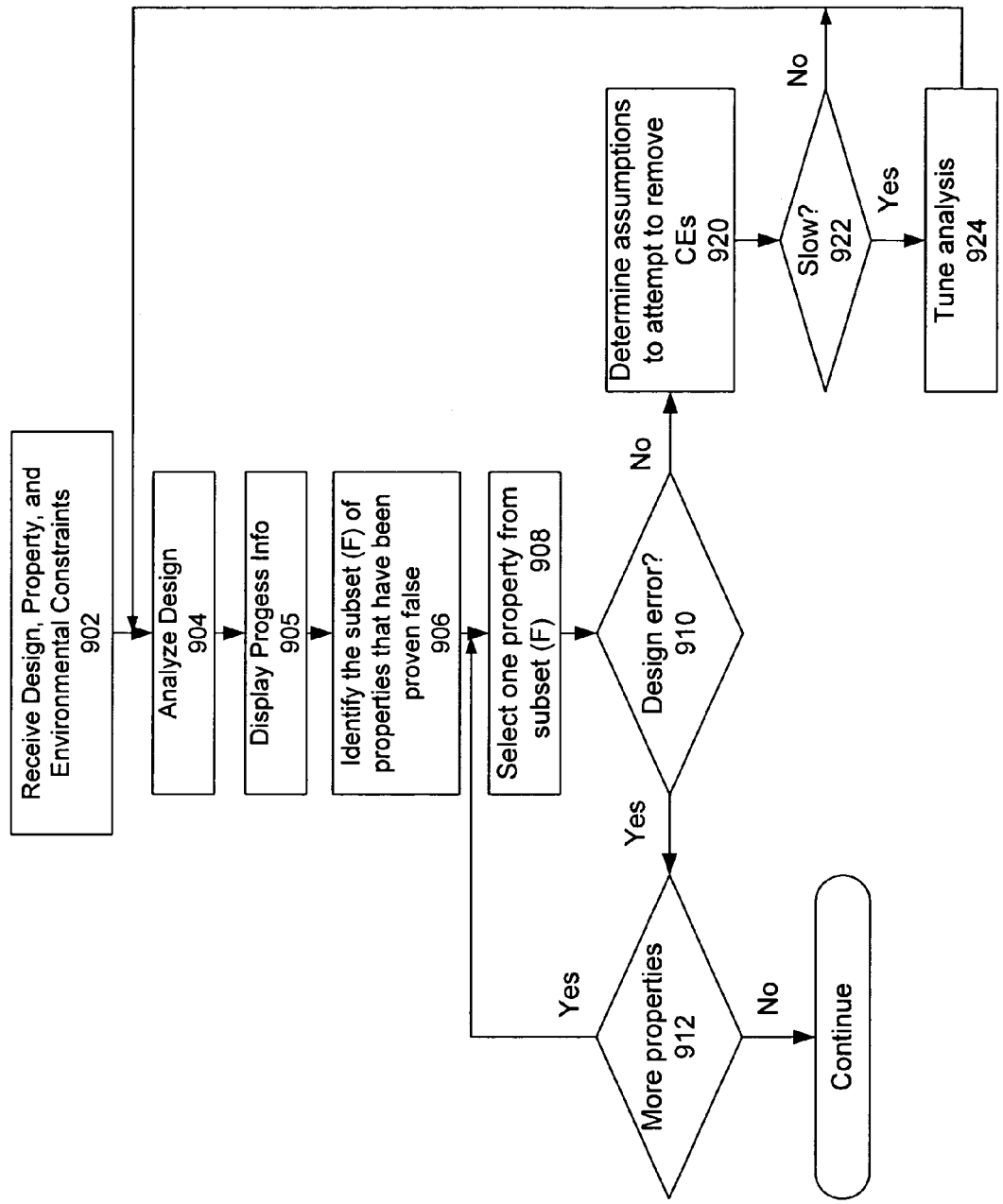
FIGS. 1A and 1B are flow charts for a process of resolving possible inconsistencies between a circuit design and its abstractions during a functional verification process, in accordance with embodiments of the invention.
Figure 1B:
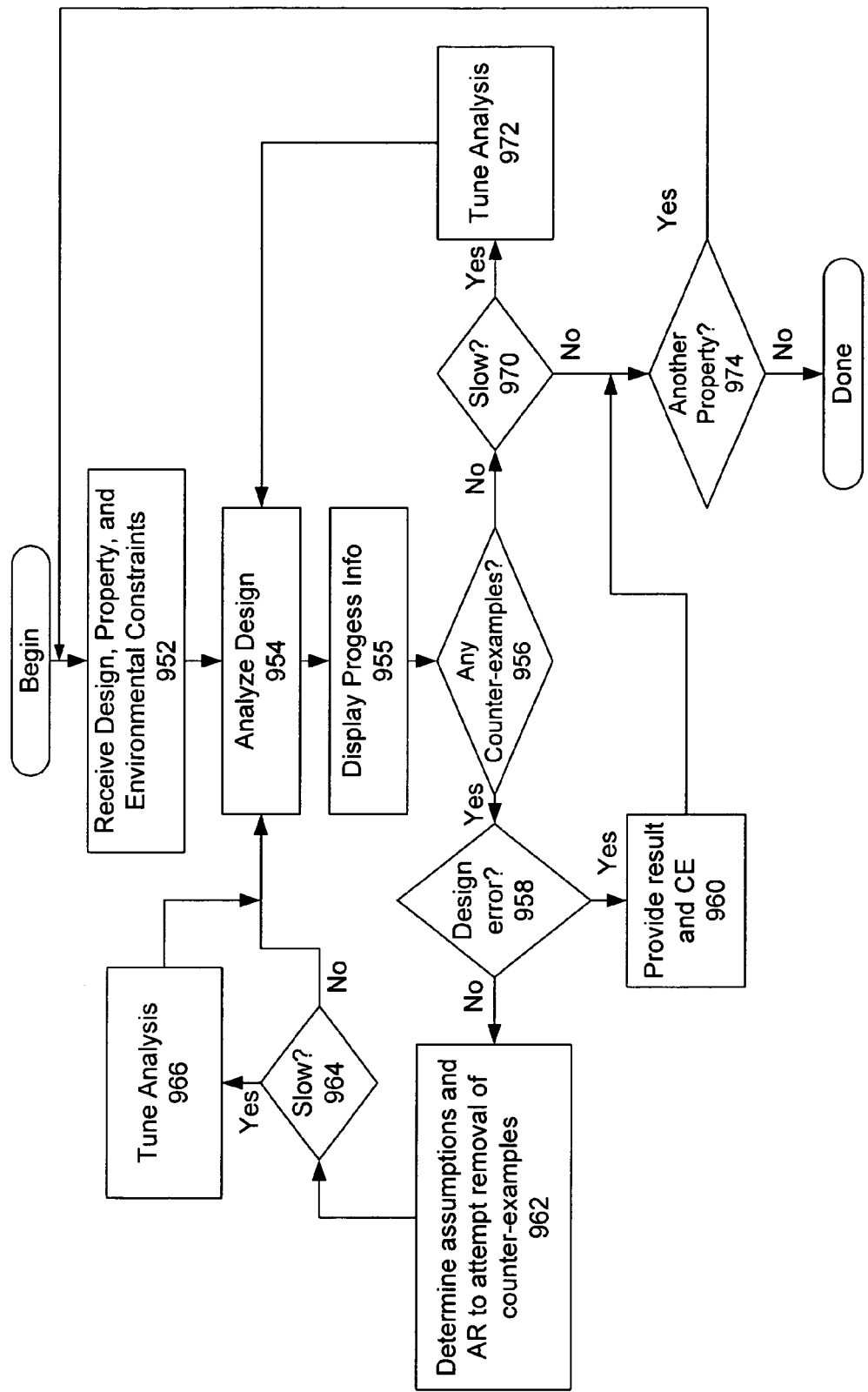

General approaches for resolving inconsistencies are illustrated in the flow charts of FIGS. 1A and 1B. The flow chart shown in FIG. 1A guides users to remove false negatives by providing feedback on the cost and effects of possible assumptions that are provided by the user or generated by the tool. FIG. 1B illustrates a similar process for guiding a user to remove false negatives, but the embodiment illustrated in FIG. 1B includes steps for dealing with methodologies that use the concept of an analysis region (AR).

With reference to FIG. 1A, a verification software suite (e.g., a "tool") receives 902 a circuit design, a set of properties or requirements, and a set of environmental constraints for the functional verification process. The tool then analyzes 904 the circuit design to perform verification thereon. In one embodiment, this analysis includes a formal verification process as set forth in U.S. application Ser. No. 10/745,993, filed Dec. 24, 2003, which is incorporated by reference in its entirety. Unless the circuit design being tested has no errors, the formal verification process results in a false result for a set of properties that are violated by the circuit design. The tool thus identifies 906 the subset (F) of properties that have been proven false, and it selects 908 a first property from this subset (F). This property, and possibly one or more counterexamples that show how the property is violated, is available to a user. For example, a user may be presented graphically with the waveform for a counterexample of the violation. Having access to this information, the user may be able to help determine the cause of the violation.

Accordingly, the user decides 910 whether the violation is the result of a design error in the circuit design or whether the violation is a false negative (e.g., due to a imprecise abstraction). Once this determination is made, the user may provide this information to the tool. If the violation trace was due to a design error, there is no inconsistency to be resolved; therefore, the tool then determines 912 whether additional properties exist and repeats the process for a next violated property. As long as there is a next violated property, the process continues and another property from the subset (F) is selected 908; otherwise, the process ends.

But if 910 the user determines that the violation was not caused by a design error, the violation was a false negative and the analysis for the verification process must therefore be adjusted. To adjust the verification analysis in one embodiment, the tool determines 920 one or more assumptions that could be added to the analysis to attempt to remove the counterexample. (An embodiment of this step is described in greater detail with reference to step 962 in FIG. 1B). Additionally, the user may determine 922 whether the process was too slow and provide that information to the tool. If 922 the process was too slow, the tool preferably tunes 924 the analysis to speed up any future verification analyses. Embodiments for tuning the analysis are described in greater detail below with reference to FIG. 2. With the analysis adjusted to attempt to remove the counterexample for the false negative, the circuit design is again analyzed 904 in accordance with a functional verification process.

With reference to FIG. 1B, an embodiment of the tool handles functional verification methodologies that apply the concept of an analysis region (AR) to a circuit design. An analysis region allows for a portion of a design to be identified as relevant for a given property so that other parts of the design outside of the analysis region can be ignored when testing the property. In this way, highly complex designs can be simplified for verification. A more detailed description of the use of an analysis region in verification methodologies is set forth in U.S. patent application Ser. No. 10/389,316, which is incorporated by reference herein in its entirety. In accordance with the process illustrated in FIG. 1B, the tool provides feedback to allow a user to evaluate the cost and effects of an action on the manipulation of the environmental constraints and/or the analysis region before the user actually directs the tool to take the action.

FIGS. 1A and 1B thus describe a method in accordance with an embodiment of the present invention for verifying a property of a given circuit model in conjunction with a set of environmental constraints while providing the user with relevant information (e.g., cost and effect of possible modifications to the environmental constraints and/or analysis regions).

With reference to FIG. 1B, the circuit description, a property to be verified and an initial set of environmental constraints are received 952 by the system as inputs. The design is analyzed 954, for example, using the method described above, to determine if a requirement is satisfied in context of the environmental constraints and the initial analysis region as determined by the tool. For ease of discussion, when an entire circuit design is analyzed, the analysis region is referred to as the entire design. The tool analyzes 954 the circuit design to determine for a number of requirements whether the corresponding property is satisfied or violated under a number of operating conditions. If the requirement is not always true, one or more counterexamples are typically generated in the functional verification process. If 956 one or more counterexamples are generated during the analysis 954, the counterexamples are presented to the user for review, as described above. A user determines 958 if the counterexample represents a true design error or a false negative. If the counterexample represents a design error, the analysis for that property can be concluded and the counterexamples outputted 960, after which the verification process may end. Specific aspects of embodiment of the invention are now discussed in more detail with reference to FIG. 1B.

Eliminating False Counterexamples

Figure 3:
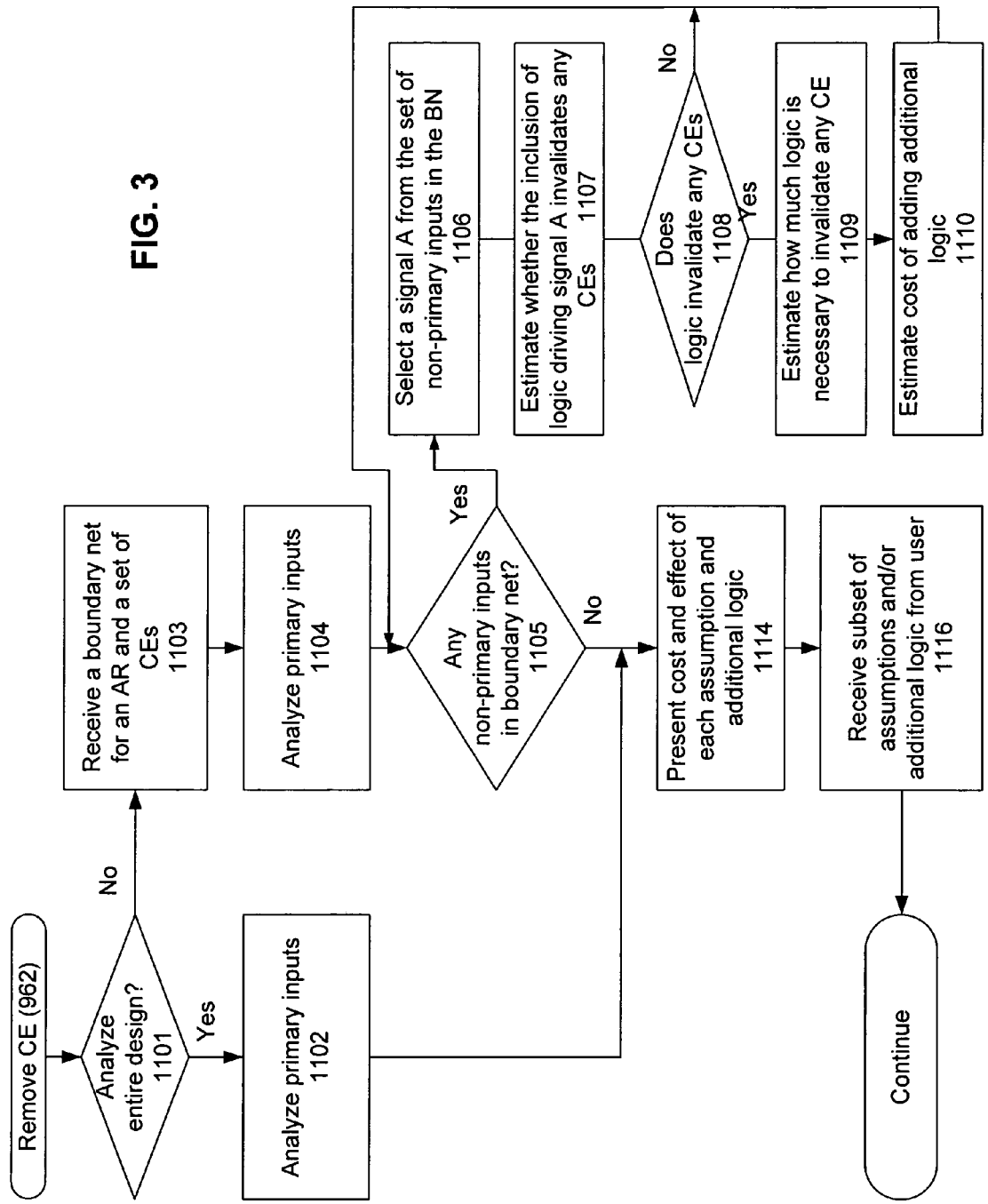
FIG. 3 is a flow chart of a process for identifying assumptions and/or modifications to an analysis region for eliminating a counterexample, in accordance with an embodiment of the invention.

As explained above, false counterexamples may be eliminated from the formal verification by adding certain assumptions to the inputs of the formal verification. With reference to FIG. 1B, if the user determines 958 that the counterexamples do not correspond to a design error, the false negative is due to an inconsistency rather than a true design error. Accordingly, the tool helps the user eliminate the counterexamples for false negatives by identifying 962 one or more assumptions to add to the analysis and/or possible modifications to the analysis region. Preferably, the cost and effect of these potential changes to the analysis are also determined and provided to the user. A more detailed description of this process is illustrated in FIG. 3, which illustrates an embodiment of a method for identifying assumptions and/or modifications to the analysis region for eliminating the identified counterexamples. The embodiment shown in FIG. 3 can be understood with reference to an example circuit design shown in FIG. 5, showing a schematic of a circuit design to be verified.

Figure 5:
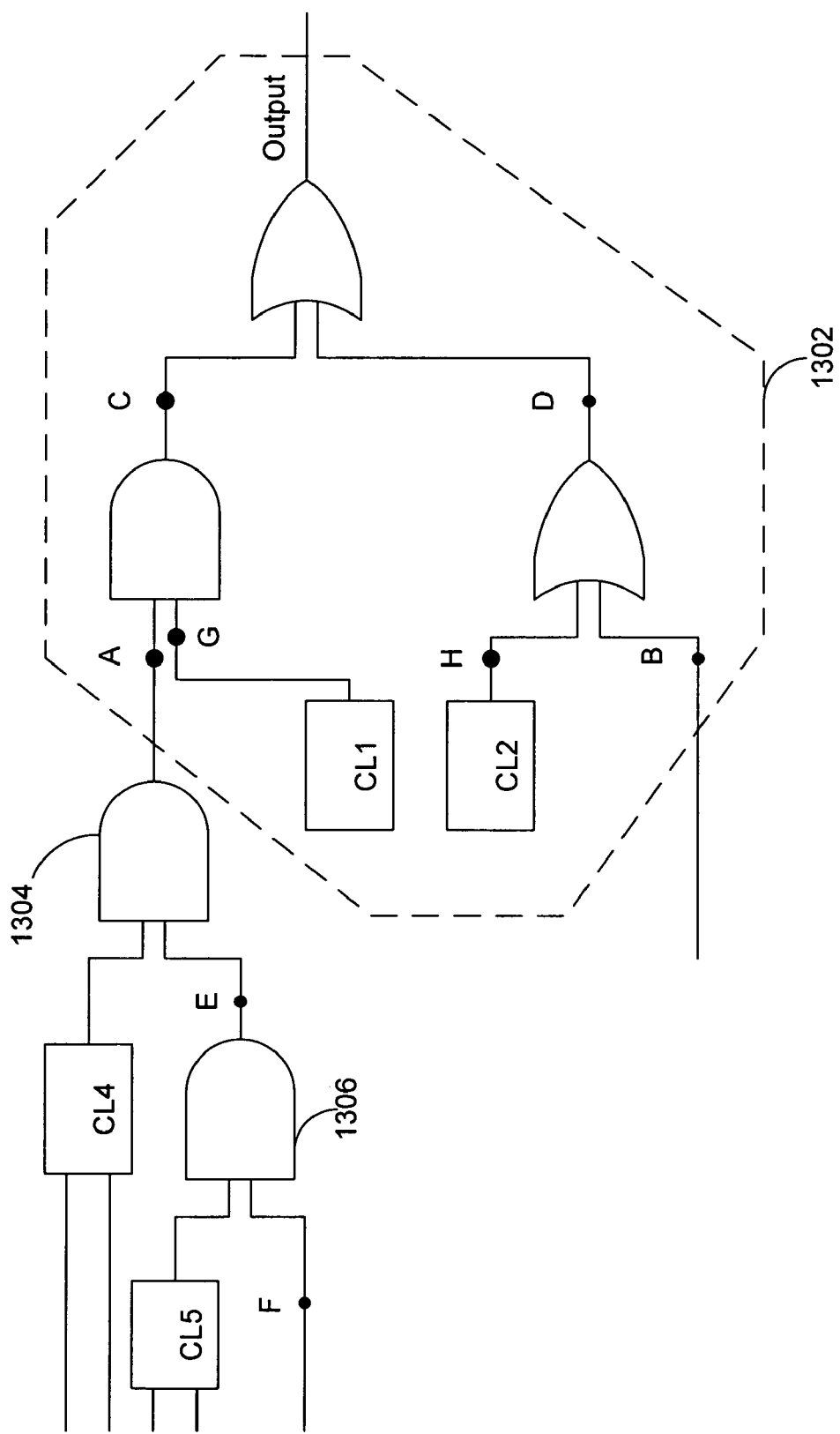
FIG. 5 is a schematic of an example of a circuit design to be verified in accordance with an embodiment of the invention.

An initial analysis region 1302 is defined for the example circuit design in FIG. 5. In this embodiment, if 1101 the analysis region is a subset of the entire design being analyzed, the tool receives 1103 a set of nets for the analysis region (AR) and a set of counterexamples (CEs). In the example, the set of boundary nets includes signal A, primary signal B, and each of the primary inputs driving complex logic CL1 and CL2 (the inputs not shown). In this example there is one assumption, F == 0, and there is one requirement to prove that the output is equal to zero at all times (Output == 0). Two counterexamples are thus identified, CE1 and CE2:

(CE1) A == 1 && B == X
(CE2) B == 1 && A == X

The tool then analyzes 1104 the primary inputs. In this example, signal B is the only primary input (into the analysis region 1302) that is relevant to the two counterexamples.

Figure 4:
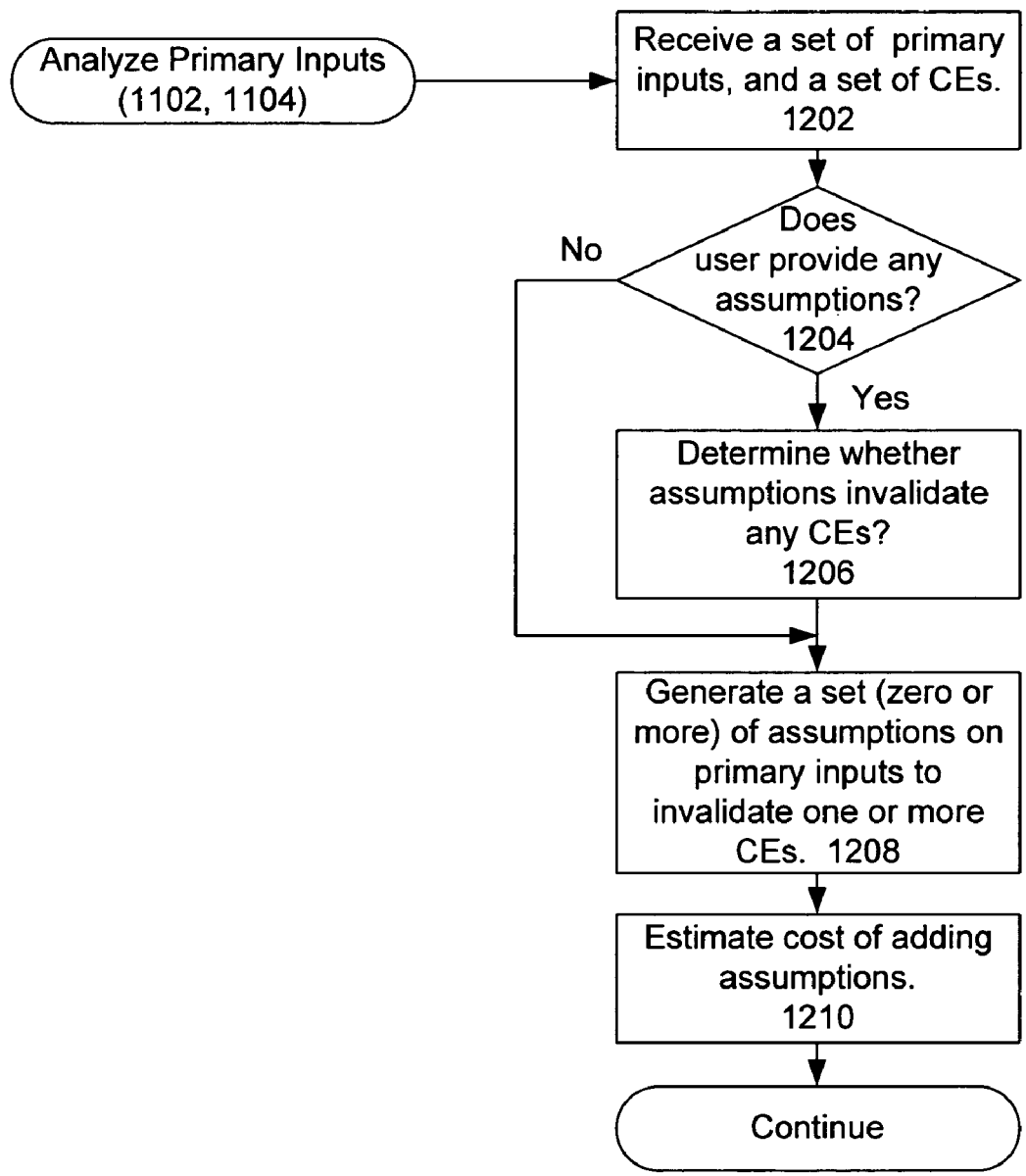
FIG. 4 is a flow chart of a process for analyzing an analysis region, such as in steps 1102 and 1104 of FIG. 3, according to one embodiment of the present invention.

A more detailed description of the step of analyzing 1104 the analysis region is set forth in FIG. 4, which illustrates a method for analyzing primary inputs according to one embodiment of the present invention. To analyze the primary inputs, the tool receives 1202 the set of primary inputs (e.g., signal B) and a set of counterexamples (e.g., CE1 and CE2). If 1204 the user provides one or more assumptions manually, the tool determines 1206 whether any of the assumptions invalidates any of the counterexamples. Otherwise, the user does not provide any assumptions on signal B and the process continues by generating 1208 a set of assumptions on primary inputs that invalidates one or more counterexamples. Each of the identified primary inputs (here, just signal B) is compared against the counterexamples to determine whether an assumption can be identified that will eliminate a counterexample. In the example, primary signal B is compared with CE1. But in CE1 signal B is a "don't care," so no assumption for signal B would eliminate CE1. For counterexample CE2, however, the value of B is equal to 1. Therefore, the tool identifies the assumption B == 0 as an assumption that will eliminate CE2.

The tool then estimates 1210 the cost/savings of adding assumptions. The cost/savings can correspond to a variety of factors that affect the performance of the verification. In one embodiment, the cost/savings is based on one or more of the following principles: (1) The size of the corresponding binary decision diagram (BDD) used to capture the assumption gives a quantitative indication of the speed of any operation that involves such an assumption, where the larger the BDD, the slower the analysis will become. (2) The assumption may also simplify the analysis by causing other assumptions or logic in the design to become irrelevant to the analysis. In the example, if an assumption "B == 1" is introduced, the signal D will have the value 1 regardless of the value in the signal H and the activities in CL2 because of the OR-gate between signal B and D. The size of the corresponding BDD used to capture CL2 gives a quantitative indication of the resulting speed up. (3) Instead of using a Boolean expression on existing signals in the design as an assumption, an assumption may assume the input to have the same value as a signal being driving by an arbitrary complex logic, in which case it may capture temporal behavior. The cost or saving of including this assumption depends on the characteristics of the logic, such as: (a) the size of the corresponding BDD used to capture the logic gives a quantitative indication of the speed of any operation involving this assumption; (b) a counter-like behavior in this logic leads to more iterations in the analysis, and therefore, the range of possible values in this counter gives a quantitative indication of the number of iterations required to complete the analysis; and/or (c) a datapath-like behavior in this logic leads to more states to be maintained as reachable set during the analysis, and therefore, the width of the datapath gives a quantitative indication of the complexity in manipulating the reachable set.

There may also be other possibilities that affect the cost/savings of adding an assumption. Additional effects may take into account generic and application-specific design characteristics, such as the use of FIFO, memory, decoder, pipeline logic, and the like. By providing feedback on the cost or savings of making this assumption, the tool may provide the user information allowing the user to make a more educated decision about whether to add any suggested assumptions. Alternatively, the user may decide to invest more time devising a better assumption or even incorporate an appropriate abstraction into the assumption. The tool may also suggest appropriate abstraction for specific characteristics of the logic.

In the example of FIG. 5, the savings of adding the assumption B == 0 is not significant because that assumption would not eliminate the need to analyze any significant block of logic. That is, since signal B and signal H are inputs to an OR gate, even if signal B were zero, the output of the OR gate (signal D) would still depend upon the output (signal H) of the complex logic block CL2. Even with this assumption, therefore, complex logic block CL2 would need to be to be analyzed. However, the BDD corresponding to "B==0" is also small, so, overall, adding the assumption would not introduce high overhead either and would probably reduce the states being stored in the reachable set. As a result, the tool may conclude that the assumption would not have an adverse effect on the performance, and, therefore, the assumption should be added to eliminate the counterexample CE2. The process then continues with the flow, returning to the completion of step 1104 in FIG. 3.

The tool continues by determining 1105 whether there are any non-primary inputs in the boundary nets of the analysis region 1302. A signal is selected 1106, and then the tool estimates 1107 whether the inclusion of this signal in the analysis region invalidates any of the counterexamples. For example, in an embodiment, the answer may be estimated through a 3-value simulation of the full design using values from the counterexample for the primary inputs. If the logic invalidates 1108 a counterexample, the tool estimates 1109 how much logic is necessary to invalidate any counterexample. Otherwise, the tool determines if there are any other non-primary inputs in the boundary net 1105. The tool estimates 1109 the amount of logic using an intelligent traversal of the netlist representing the design. This traversal can be performed using a conventional depth first search (DFS) algorithm. During the traversal, the search explores the part that is inconsistent when the values from the counterexample and from the simulation are different.

In the example of FIG. 5, the only boundary net that is not a primary input is signal A (as signal B is a primary input). The tool identifies the logic driving signal A as an AND-gate 1304 that is driven by signal E and complex logic block CL4. Since the value of A is 1 in CE1, the tool determines whether E or CL4 must be 0. If so, it would invalidate CE1. During the DFS, the next signal being considered is E, and the tool identifies that it is the output of an AND gate 1306 having inputs of signal F and complex logic block CL5. Therefore, the tool determines whether F or CL5 must be 0. Since an initial assumption the invention received at step 902 is that signal F is equal to 0, the tool determines that with F == 0, signal E must be zero and subsequently signal A must be equal to zero. If A == 0, then counterexample CE1 is invalidated because it requires signal A to be equal to one. Accordingly, the tool estimates 1109 that adding the two AND-gates (1304,1306) and the assumption "F == 0" to the current analysis will invalidate CE1. Furthermore, since F == 0, complex logic block CL5 does not need to be analyzed since its output has no effect on the verification. Similarly, since E == 0, complex logic block CL4 does not need to be analyzed since its output has no effect on the verification.

The tool then estimates 1110 the cost of adding additional logic. As described above, a variety of measures can be used to estimate the cost/savings of adding additional logic. In one embodiment, instead of using a Boolean expression as an assumption, the tool can use the logic driving the boundary nets. As a result, the complexity of the logic as determined by the size of the BDD used to capture the logic is usually higher than an assumption. Furthermore, it may be desirable to analyze cost or saving according to the characteristics of the logic, such as whether it is a counter, a datapath, a memory, a decoder, or other circuit component.

In this example, the cost of adding additional logic includes the cost of adding two AND gates 1304 and 1306. However, the cost of complex logic blocks CL4 and CL5 are not included because the output of these complex logic blocks has no effect on the Output signal. As a result, the corresponding BDD represents a three-input AND-gate. Furthermore, if this BDD were combined with the BDD corresponding to the assumption "F == 0", the analysis can be simplified into a BDD that says A == 0, which is even simpler than the three-input AND-gate. Furthermore, because the tool identified that the assumption F == 0 implies A == 0, the value of signal G has no effect on the output (since if A == 0, then C == 0). Accordingly, the tool includes in the cost estimation the cost saved by eliminating the logic (CL1) that drives signal G. The cost savings can be estimated based upon the size of the BDD representing the CL1 logic, as well as whether the CL1 logic is a counter.

After estimating the cost and effect of each assumption and additional logic to the analysis region, the tool presents 1114 the cost and effect to the user using a graphical user interface or other technique to provide the user with the information (e.g., sending the information to a file). The tool provides to the user the assumptions, effect, and cost generated in step 1104 or 1102 (discussed below) along with the cost and effect of adding logic as determined in steps 1108 and 1110. The invention may also prioritize the assumptions by their effects and costs and extract analysis such as "adding assumption A will lead to a faster analysis than adding assumption B" or "adding both assumptions A and B will remove all existing counterexamples, but it will slow down the analysis." Furthermore, the tool may suggest a possible abstraction that allows incorporation of a certain assumption with reduced cost. The tool may also prioritize adding additional logic by their effects and costs, and extract analysis, such as: "adding the logic driving signal A will remove the existing counterexample, but will slow down the analysis."

In this example, the tool outputs the assumption B == 0, the effect of the assumption (i.e., an indication that this assumption will eliminate counterexample CE2), and the cost of adding this assumption (which, in this example, is not significant and can be elaborated as the size of additional BDDs). The tool suggests adding the additional logic driving signal A, the effect of adding the logic, i.e., an indication that this assumption will eliminate CE1, and the cost of adding the additional logic including the savings of removing other logic (CL1) which is not needed. The tool then receives 1116 a selection of the assumptions and/or additional logic from the user, who may use the information provided by the tool to make an intelligent selection. While the user may select all, some, or none of the possibilities generated by the tool and may provide other assumptions or logic that have not been suggested by the tool.

Alternatively, if 1101 the verification is of a complete design (e.g., if the analysis region is the entire design to be verified), the tool will analyze 1102 the primary inputs of the design. As with step 1104, the tool may analyze 1102 the primary inputs as described in more detail above with respect to FIG. 4. After analyzing 1102 the primary inputs, the cost and effect of each assumption is presented 1114 to the user, after which the tool receives 1116 a subset of the assumptions from the designer as described above. In this case, during the tuning 916 of the analysis, described below, one embodiment of the invention may focus on removing or changing assumptions. This allows the tool to keep the analysis region as the full design. Another embodiment may focus on adding assumptions or removing logic from the design to form an analysis region that is less than the entire design.

Figure 6:
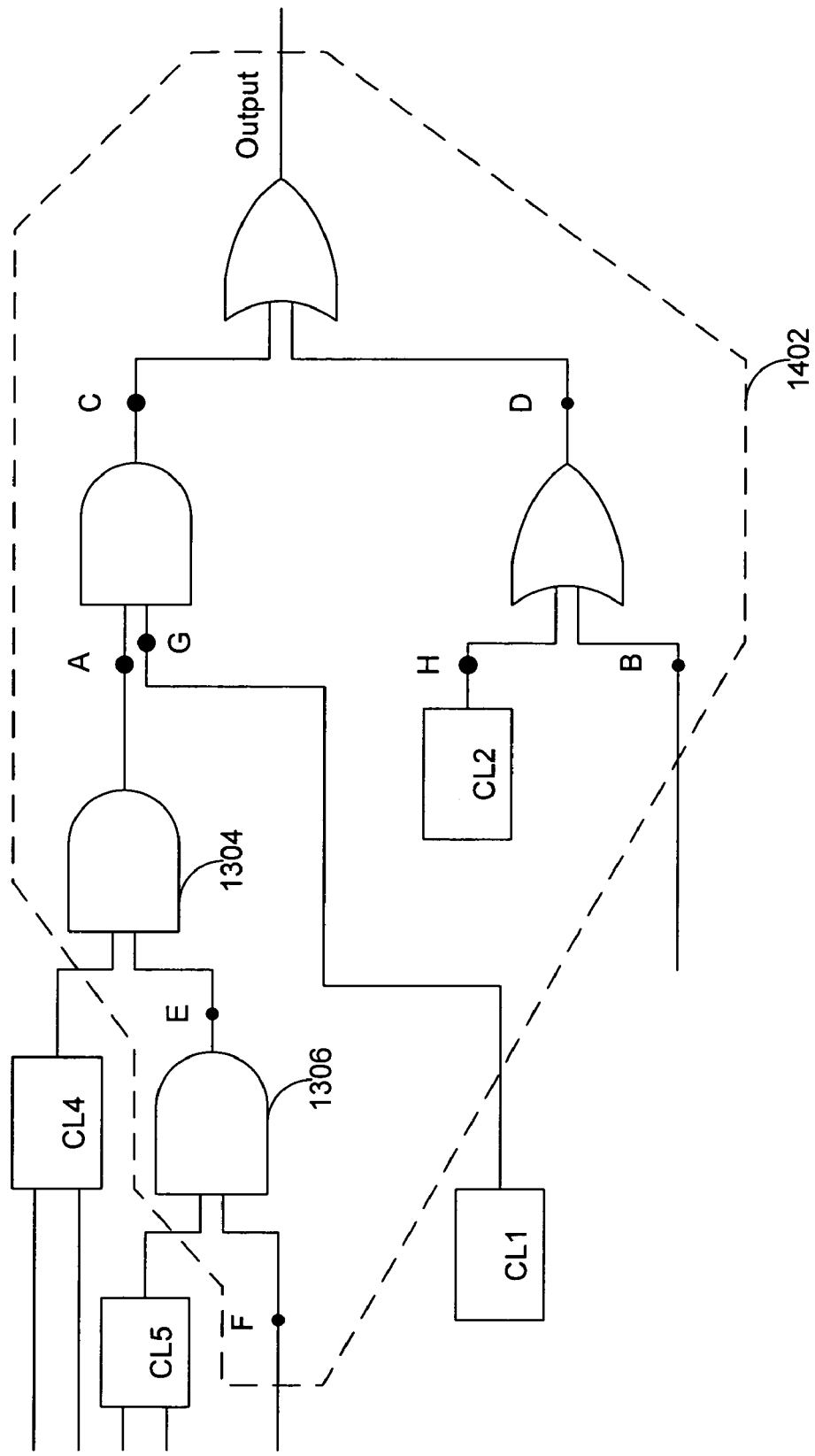
FIG. 6 is a schematic of the example shown in FIG. 5 having an analysis region adjusted in accordance with an embodiment of the invention.

In this example, the user may elect to utilize the additional logic driving the signal A (including AND gates 1304 and 1306) and the assumption B = 0. Therefore, the analysis region 1402 changes, as illustrated in FIG. 6. FIG. 6 illustrates an example of a design to be verified according to the modified analysis region.

Tuning

Figure 2:
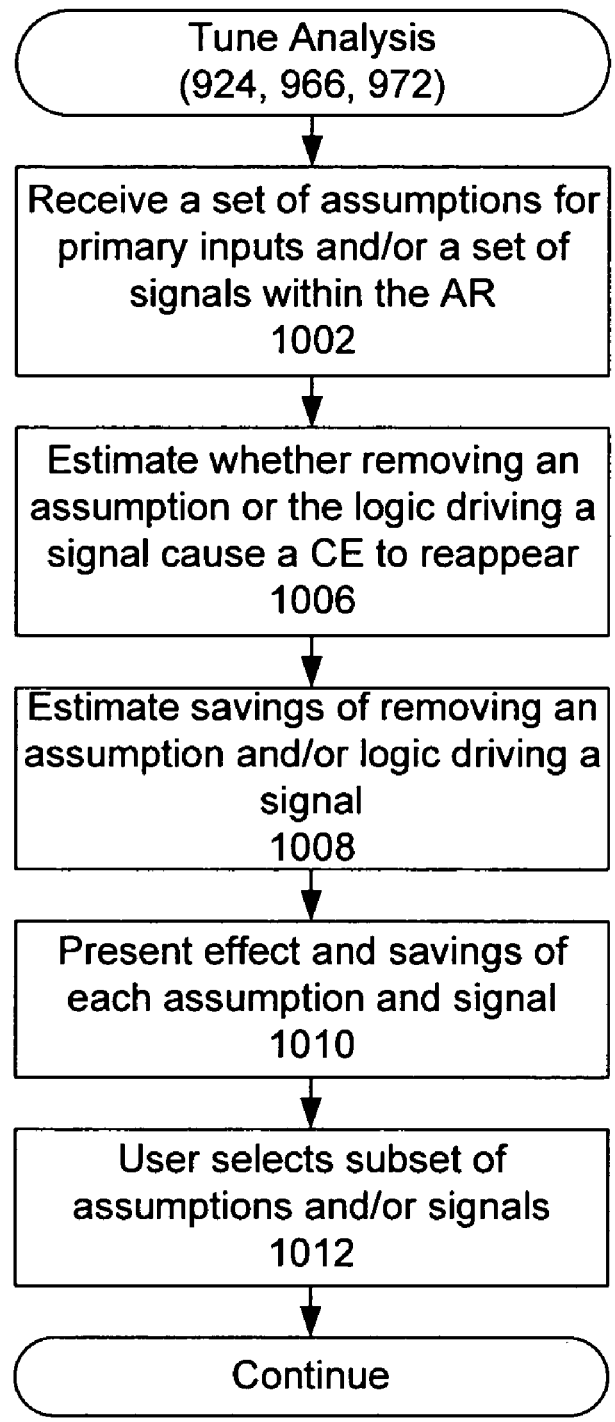
FIG. 2 is a flow chart of a process for tuning a circuit design for functional verification, in accordance with an embodiment of the invention.

Referring again to FIG. 1B, after determining 962 potential assumptions and potential analysis regions to attempt removal of counterexamples, the tool receives an indication from the user as to whether 964 the verification process was too slow. This user input can be obtained through any of a number of know user interface means, such as by requesting this information through a dialog window. It is not uncommon for verification processes to take several hours to prove complex designs. If 964 the user determines that the process is too slow, the tool provides options and information to the user regarding how to decrease the verification time by tuning 966 the analysis. FIG. 2 describes in more detail one embodiment for tuning 966 the analysis.

FIG. 2 illustrates a method for tuning the analysis according to one embodiment of the invention. The tool receives 1002 a set of assumptions for primary inputs and/or a set of signals within the analysis region. In the example described above and illustrated in FIG. 6, the current set of assumptions for the primary inputs is:

B == 0
F == 0

In this example, signals within the analysis region include signals C, D, H, A, E, etc. In step 1002, the tool may select a subset of these signals to be analyzed or the user may identify them manually. In one example, the signal H is selected by the tool or by the user. The analysis region 1402 is analyzed and the set of stored counterexamples would be CE1 (A == 1 && B == X) and CE2 (B == 1 && A == X). As mentioned above, the goal in the example is to prove that the Output signal is zero at all times. In this example, there are no outstanding counterexamples, since the user accepted the assumption and additional logic to eliminate the counterexamples in step 962. In other examples, however, counterexamples may exist, but their existence does not change the tuning analysis 966 process in one embodiment of the present invention. Since the process steps can be accomplished differently (e.g., steps 964 and 966 can occur before 962), in an alternate embodiment the analysis tuning 916, 922 can account for whether making another assumption or adding/removing logic will eliminate an existing counterexample.

The tool estimates 1006 whether removing an assumption or logic driving a signal will cause a previously invalidated counterexample to once again become a valid counterexample. The tool iteratively analyzes each assumption and logic that drives a signal to determine whether such a known counterexample becomes valid. In this example, the tool analyzes the situation where the assumption B == 0 is eliminated and determines that eliminating this assumption has no effect on the first counterexample CE1 but will cause the second counterexample CE2 to become valid once again. Similarly, the tool analyzes the situation where the assumption F == 0 is eliminated and determines that eliminating this assumption has no effect on the counterexample CE2 but will cause the counterexample CE1 to become valid once again. The invention then analyzes whether removing the logic that drives signal H will cause a previous counterexample to become valid. In this example, removing the logic that drives signal H (CL2) will not cause either CE1 or CE2 to reappear.

The tool then estimates 1008 the cost savings of removing each assumption and each collection of logic driving a signal. Removing the assumption B == 0 will not result in any significant cost increase because no logic has been eliminated due to this assumption. In contrast, removing the assumption F == 0 will result in a significant cost increase because the cost of analyzing complex logic blocks CL1, CL4, and CL5 (or alternatively only CL1, since CL4 and CL5 can be eliminated by modifying the analysis regions) is significant in this example. The complexity may be on the order of several thousand because of the sizes of the BDDs for three pieces of logic. Because of the complication introduced by the logic blocks originally rendered irrelevant by the assumption, the tool may present several alternatives regarding the assumption "F == 0". For example, the tool may put back CL1, CL4, and CL5 so that the cost would be high, or alternatively keep out CL1, CL4, and CL5 so that the cost would be low but the chances of causing a new counterexample to appear is high. Removing the complex logic that drives signal H (CL2) will also result in a cost savings based upon, for example, the size of the BDD representing the CL2 logic.

The cost information and the effect on previous (or existing) counterexample information is presented 1010 to the user, which allows the user to select 1012 none, one, or more than one of the assumptions and/or logic driving signals. In addition, the tool permits the user to enter assumptions or modify the logic to be analyzed that the tool does not present. In this example, the user may elect to eliminate the logic (CL2) that drives signal H. It is noted that while the removal of the logic CL2 will not cause the previously invalidated counterexamples to reappear, it will lead to a new counterexample that represents a false negative, as removing CL2 enables H to take value 0 or 1 at any time.

Referring to FIG. 1B, once the tuning 966 is performed (if at all), the tool again analyzes 954 the design with the modifications selected by the user. In this iteration of the design analysis, one counterexample (CE3) is identified:

H == 1 && B == X && F == X

That is, the output is equal to 1 when signal H is equal to 1. The tool identifies 956 that a counterexample exists and the user indicates 958 that the counterexample is not the result of a design error. Then the tool attempts to remove the counterexample in step 962. As described above, step 962 is described in greater detail in FIG. 3. Since the entire design 1101 is not being analyzed, the tool receives a set of boundary nets for the analysis region along with the currently valid counterexamples, i.e., CE3. Eventually the tool detects the addition of logic CL2 will invalidate CE3 and the user may select to add CL2 back into the analysis region.

The tool then analyzes 1104 the primary inputs (signals B and F) as described above with reference to FIG. 4. The tool identifies whether the user has added 1204 any additional primary input assumptions. In this example, no additional assumptions are added, so the tool attempts to generate a set of assumptions on primary inputs that will eliminate counterexamples. Neither signal B nor signal F will have any effect on CE3 because both are "don't care" in CE3. The process continues by determining 1106 whether any logic drive the inputs to the analysis region 1402. Complex logic block CL2 drives signal H, which is an input to the analysis region. It is noted that CL2 is the logic that was previously eliminated from the analysis region in step 966. The tool estimates 1108 how much logic is necessary to invalidate any counterexample. In this example, the invention estimates 1108 that entire block CL2 should be added to the analysis region. The tool then estimates 1110 the cost of adding CL2 back and presents 1114 the cost and effect of adding the logic to the user. The user may elect to add CL2 back despite the cost because it eliminates a counterexample, and the tool receives 1116 the instruction provided by the user.

In one example, the user does not indicate 964 that the analysis is too slow, and the design is analyzed 954 once again. If no counterexamples are generated 956 by the design analysis 954, the user is then provided an opportunity to indicate 970 whether the analysis was too slow. If the analysis was not too slow, as indicated by the user, the process ends. If the analysis was too slow, the tool again tunes 972 the analysis as described above with reference to step 966. The analysis tuning process 972 is described in greater detail with reference to FIG. 2. The tool receives 1002 the set of assumptions for primary inputs and/or signals within the analysis region, as set forth above. Then the tool estimates 1006 whether removing an assumption or logic driving a signal will cause a counterexample to reappear. At this point, the tool analyzes the assumptions with reference to counterexamples CE1, CE2, and CE3. In addition, the logic that drives signal H (CL2) is analyzed. But since the previous iteration of step 1006 (which was called from step 964), a new counterexample was identified and eliminated (i.e., CE3). In estimating 1006 whether the removal of complex logic CL2 will cause a counterexample to reappear, the removal of CL2 is compared to CE3 (H == 1). Removing the logic CL2 may result in the reappearance of CE3, and this information is presented 1010 to the user along with the other effects and savings 1008. The user decides 1012 whether to make any modifications to the assumptions or signals, in this example the user decides that no additional modifications are necessary. In one embodiment the tool continues by analyzing 954 the design. In another embodiment, since no changes occurred in the analysis tuning step 972, the process ends.

Because the above examples only have combinational logic, the cost can be determined easily using, as one factor, the size of the BDD representing the logic. When sequential logic is in the design, however, different factors are used to determine the cost/complexity. In addition, the tool may also operate with other design elements, such as multiplexers. Additional details regarding their operation is set forth in U.S. application Ser. No. 10/745,993, filed Dec. 24, 2003, which is incorporated by reference in its entirety.

Analysis and Debugging of Circuit Designs

In one embodiment, the tool is configured to enable simultaneous analysis and debugging of a circuit design. The automated mathematical analysis associated with some functional verification methods occurs simultaneously with the manual user analysis on the intermediate results of the verification. This simultaneous capability avoids the wait times that would result if the user were required to wait for the automated analysis to return an intermediate result before the user can actively analyze or debug that intermediate result. Beneficially, the debugging and analysis methodology enabled by this tool further allows users to direct the next formal verification step toward the completion of a formal proof. It may also help guide a user to learn about a current analysis region with respect to a particular requirement that is being proven.

The techniques described herein are not limited to any particular verifications or analysis methodologies. For example, embodiments of the tool may be used to enhance interactivity in a formal verification process or in a simulation method. When applied to simulation methods, for example, the background analysis feature allows a verification engineer to learn about the circuit design while running a simulation in the background.

The tool thus allows a user to perform debugging activities at the same time the tool is performing an analysis of a circuit design or current analysis region of the design. One benefit is that the debugging activities become a persistent activity while the actual formal analysis is typically carried out in the background. When applied to formal verification techniques, this capability enables a formal verification tool to become fully integrated into a design flow in which the designer or the verification engineer can use the tool as a debugging aid in an early phase of the design cycle and as a 100% proof verifier in a later phase of the design cycle.

In one embodiment of a design methodology, the generation of a formal proof is broken down into multiple steps in a functional verification analysis. The steps of the functional verification provide a user with intermediate results, allowing the user to provide insight about a circuit design between the steps after manual analysis of the intermediate results. This approach can be described in U.S. application Ser. No. 10/745,993, filed Dec. 24, 2003, which is incorporated by reference in its entirety, describing a methodology enabling interactivity in the functional verification of a requirement of a circuit design.

Figure 7:
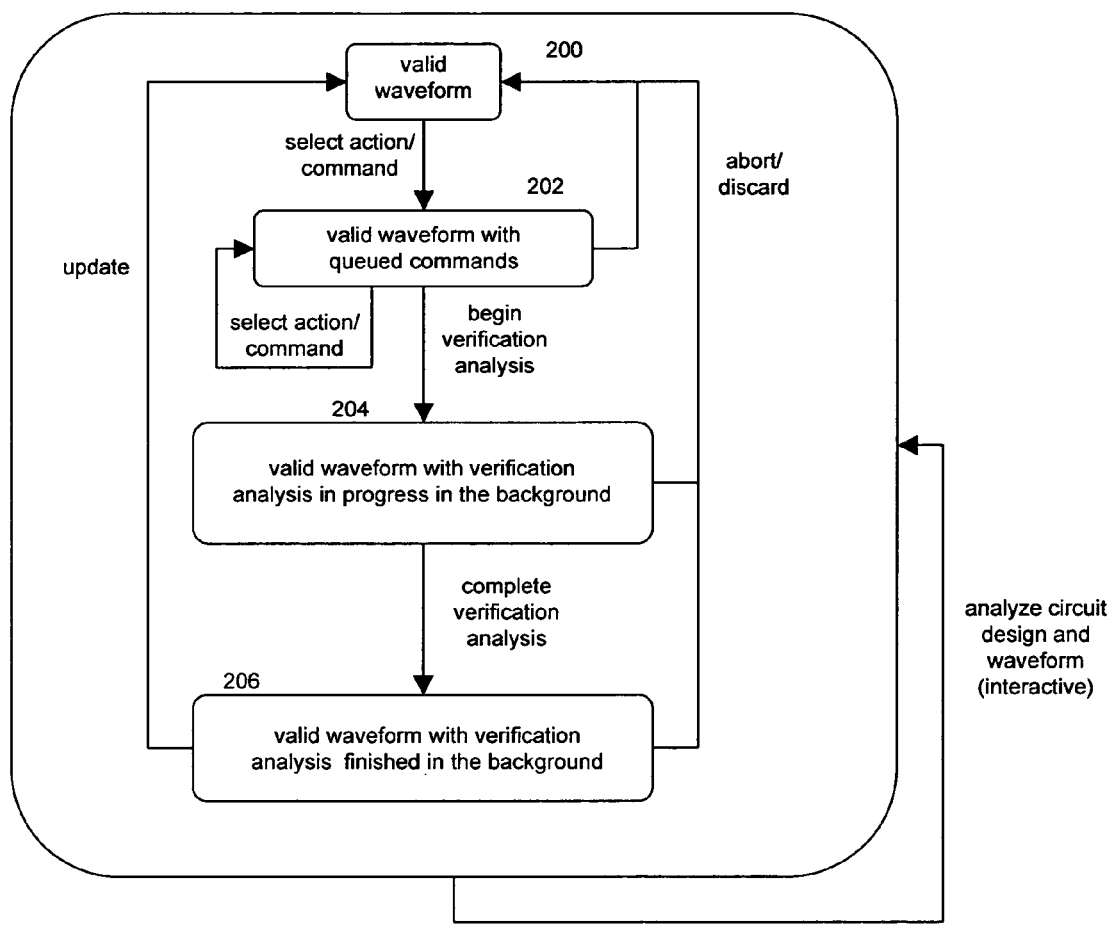
FIG. 7 is a state diagram illustrating the operation of a tool that allows for debugging of a circuit design while performing formal analysis on a requirement of the design in the background, in accordance with one embodiment of the invention.

FIG. 7 illustrates the operation of a tool that allows for debugging of a circuit design while performing formal analysis on a requirement of the design in the background, in accordance with one embodiment of the invention. The operation of the tool shown in FIG. 7 may be an optimization of the general method laid out in FIGS. 1A and 1B. In FIG. 1B, the step 954 of analyzing the design can take heavy computation resources and time, and steps 958, 962, 966, and 972 may require some user interaction to decide and implement the actions to modify the design before performing another step 954 of analyzing. The operation illustrated in FIG. 7 can be applied to these steps to enable these two time-consuming processes (automated analysis and user-influenced debugging) to happen at the same time, and yet provide a use model that is easy for a user to understand.

With reference to FIG. 7, the tool enters state 200 once a waveform is presented to the user. The waveform is typically generated from the result of a previous formal analysis of a requirement on the circuit design (e.g., a functional verification process). When the user selects a new action for the proof engine, the tool goes into state 202. In one embodiment, the action selected by the user may include adding assumptions, modifying the analysis region, tuning the design, and the like. After one or more actions have been selected by the user (e.g., queuing up the actions for a subsequent formal verification step), the user can select to begin the formal analysis in the background, and the tool goes into state 204.

In state 204, the tool performs a formal analysis of a requirement on the circuit design in a background process. This analysis is performed using the most recent information provided by the user, including any actions selected by the user. In the state 204, however, the tool also allows the user to continue analyzing and debugging the design manually. In one embodiment, in state 204, the tool displays a waveform of portions of the circuit design. This allows the user to determine, for example, (1) whether to add new actions as an appropriate modification to the current analysis, and (2) whether a counterexample indicates a real bug in the circuit design or a flaw in the abstraction of the design. To enable the new analysis of a circuit design while concurrently continuing a previous analysis of the circuit design, the tool may store or cache a copy of the previous analysis of the circuit design before beginning the analysis. The formal verification can then be performed on the copy of the previous analysis of the circuit design, allowing the other version of the analysis to be modified.

While the background functional verification analysis is running, in state 204, the user can at the same time continue to analyze possible actions to modify the previous analysis process of the circuit design. These actions can be applied to a subsequent verification analysis of the circuit design. The ability to analyze the design at any point in the process is illustrated in FIG. 7 by the arrow labeled "analyze," which can be performed from any of the states 200, 202, 204, and 206.

If, for example during an analysis of the circuit design, the user decides that the waveform is actually a real design error, the user can abort the formal analysis that is running in the background. The abort action stops the formal analysis of the design and takes the tool back to state 200. Accordingly, aborting the analysis returns the tool to a state as if the background functional verification analysis has never been initiated and no queued actions were entered. Similarly, if the user decides the original queued commands are not appropriate, the formal analysis in the background can be aborted, and a new set of actions can be queued up to continue the analysis.

The user may also decide to abort the formal analysis running in the background if the user decides that there is a way to tune the functional verification analysis to make it faster. This action similarly takes the tool back to the same state 200 as if the background analysis has never been initiated and the queued actions were not entered. After the abort action, in state 200, the user may enter new actions, including the original set of queued actions, to speed up the analysis and then restart the background analysis of the circuit design with the new actions. Alternatively, an abort takes the tool back to state 202, and the original set of queued actions is saved.

Accordingly, the tool facilitates the user's analysis and debugging of the circuit design in a number of ways. In various embodiments, the debugging and analysis functions that the tool may allow while the functional verification is performed in the background include, but are not limited to: providing the ability to add signals to the waveform; diagnosing why a signal has a specific value by cross referencing to the design's source code; determining the characteristic of a current analysis region, the region boundaries, the state flops within the region, and the like; and attempting to generate a different waveform using a user-specified restriction. Moreover, the tool enables the user to perform these actions while a formal analysis of the requirement of the circuit design is running in the background.

Once the background verification analysis finishes, the tool may return a result of "true" or "false." This may occur while user is still analyzing the waveform. If the result is true, the tool moves from state 204 to state 206 and notifies the user that the requirement of the circuit design has been proven. If the result is false, the tool will continue to compute the waveform in the background. When the waveform is generated, the tool moves from state 204 to state 206 and notifies the user. This new waveform generated illustrates the result generated by the background verification analysis. The waveform is generated in the background.

Once the verification analysis of the circuit design is completed, in state 206, the user has two choices. The user may discard the result (and associated waveform) if the user does not think it is useful. Discarding the result returns the tool to the initial state 200 with the original waveform displayed. Alternatively, the user may update the result so that the new waveform determined from the background verification process is displayed, in state 200. Effectively, this updates the tool, bringing the result from the background to the foreground.

Figure 8:
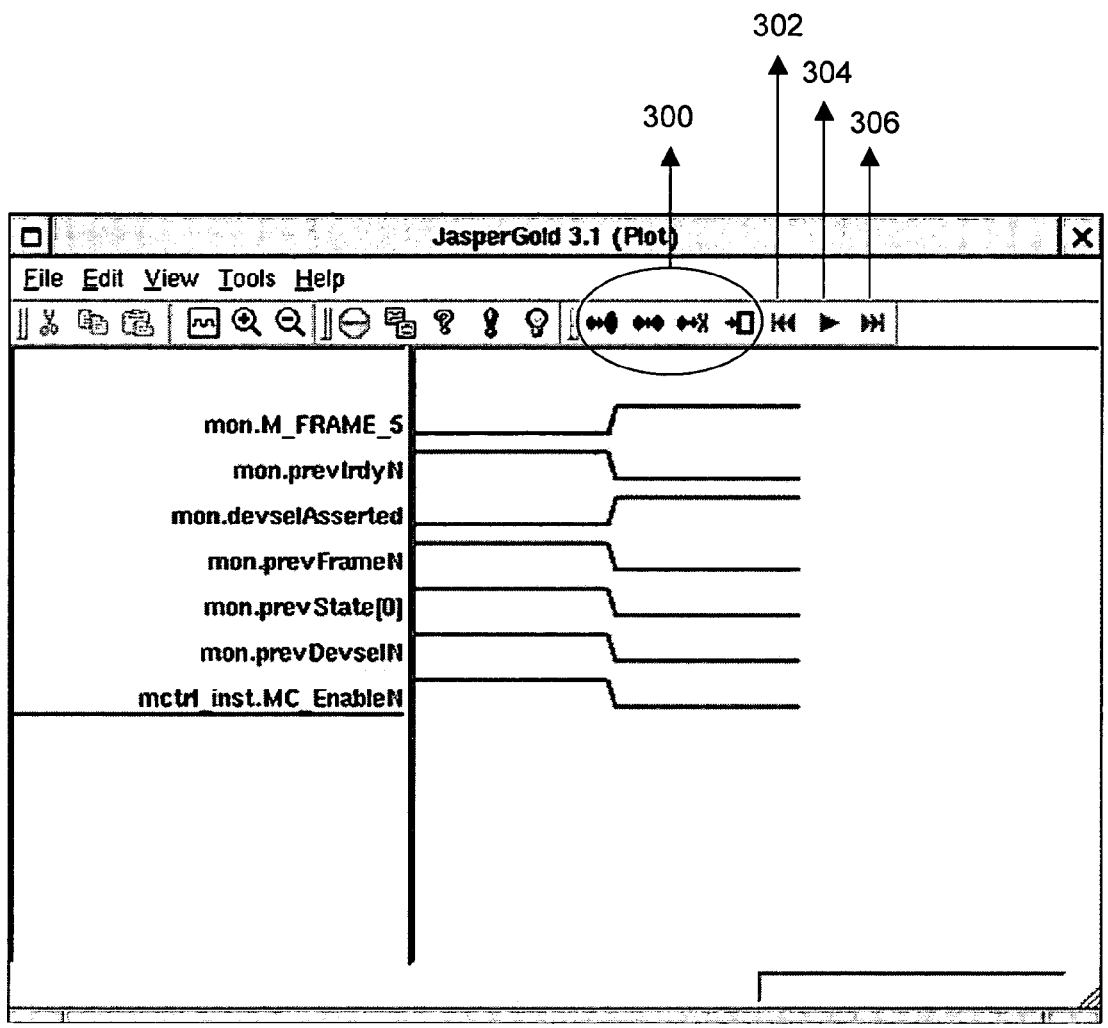
FIG. 8 illustrates a user interface for operating the tool, in accordance with one embodiment of the invention.

FIG. 8 illustrates one embodiment of a user interface for operating the tool in accordance with the process described above. The graphical interface includes a set 300 of four buttons that allow the user to enter the actions to be queued for use in a next formal verification analysis cycle. Button 302 allows the user to discard the current analysis, button 304 allows the user to initiate a formal analysis, and button 306 allows a user to update the current analysis.

As shown in FIG. 8, the tool is in the initial state 200, and buttons 302, 304, and 306 are disabled because the user cannot select their functionalities from state 200. Once the user has queued at least one action, the discard button 302 and the continue button 304 are enabled. The user can then start a background functional verification analysis by selecting the continue button 304 or can remove the queued actions by selecting the discard button 302. Once the background analysis is finished (state 206), the update button 306 is enabled, and the user can select either the discard button 304 or the update button 306, as desired. The enabling and disabling of the buttons provide an intuitive way to present the state of the tool with respect to the operation of the embodiment of the tool described in FIG. 7.

In one implementation of the tool described herein, the necessary data are copied from the formal analysis tool to a cache or other memory storage. The tool then performs the functional verification analysis on this copy of the design, allowing the retained version of the design to be debugged concurrently with the formal analysis. In one embodiment, the data that are saved include the configuration of the analysis region, as the analysis region used in the new formal analysis in the background will typically be different from the analysis region for the waveform from the previous analysis. The saved data preferably also include any assumptions provided by the user for the circuit design used in the background analysis.

In addition, the data from which the counterexamples can be analyzed are also copied to the cache. For example, in one embodiment, if the formal analysis is performed by forward reachability analysis using a binary decision diagram (BDD), the BDDs representing the reachable states at each time step are copied to the cache. Using these BDDs and the analysis region information, different counterexamples and values for individual signals can be generated. In one embodiment, to minimize the memory usage, the tool selectively copies the needed data instead of having two complete copies of the proof engine.

In one embodiment, aborting a functional analysis that is being performed in the background is implemented through an exception mechanism. For example, when a binary decision diagram (BDD) is used, the abort action can set a flag, and a checkpoint to monitor the flag can be made whether an operation using BDD starts, or when a BDD variable reordering is triggered. If the flag is set, an exception can be thrown.

Accordingly, the process of debugging a design and the processing of proving a requirement on a design can be combined in the same tool. For debugging purposes, the user expects the tool to be constantly available for manipulation of the waveform and the source code browsing. For formal verification, the tool should spend sufficient computing resources and time to analyze the design and the requirement being tested. Using the tool, formal verification is made an integral part of the debugging process instead of a batch-mode tool for post analysis.

Apart from enabling the merging of a debugging tool and a formal verifier, embodiments of the present invention also enable the user to change views about the direction in which the formal process should go. Once step 200 is reached, the user can quickly set up the tool to further analyze the design and the requirement with respect to some plausible actions. While the tool is busy looking into the new actions specified by the user, the user can continue to look for alternate actions that may be better than the current course of actions. Without this ability, the user would have to be careful in selecting a next set of actions, because once they have started the formal analysis, they would not be able to continue investigating alternative solution using the same invocation of the tool.

Summary

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

As described, various embodiments of the invention allow a user to specify requirements graphically using a waveform and an interactive and/or automatic generalization process. These embodiments may take the form of standalone software, or they may be embedded as tools within a larger circuit design software environment.

Moreover, any of the steps, operations, or processes described herein can be performed or implemented with one or more software modules or hardware modules, alone or in combination with other devices. It should further be understood that any portions of the system described in terms of hardware elements may be implemented with software, and that software elements may be implemented with hardware, such as hard-coded into a dedicated circuit. In one embodiment, a software module is implemented with a computer program product comprising a computer-readable medium containing computer program code, which can be executed by a computer processor for performing any or all of the steps, operations, or processes described herein.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

The foregoing description of the embodiments of the invention has thus been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

What is claimed is:

1. A computer program product computer-implemented method for debugging and verifying a circuit design, the computer program product comprising a computer-readable medium containing computer program code for performing the method comprising:
    receiving a set of results from a first functional verification analysis of a circuit design;
    initiating a second functional verification analysis of the circuit design in a background operation;
    while performing the second functional verification analysis, receiving a user input for analyzing the results from the first functional verification analysis of the circuit design;
    aborting the second functional verification analysis;
    responsive to an input from the user, tuning a set of commands for performing the second functional verification analysis to obtain a tuned set of commands; and
    initiating a third functional verification analysis in a background operation, the third functional verification process performed using the tuned set of commands.

2. The computer program product of claim 1, the method further comprising:
    while performing the second functional verification analysis on the circuit design, presenting the set of results from the first functional verification analysis of the circuit design for visualization by a user.

3. The computer program product of claim 1, wherein the set of commands includes one or more assumptions for the circuit design for use in the functional verification analysis.

4. The computer program product of claim 1, wherein the set of commands includes a definition of an analysis region in the circuit design in which to perform the functional verification analysis.

5. The computer program product of claim 1, the method further comprising:
    completing the second functional verification analysis, the second functional verification analysis producing a set of results for the second functional verification analysis; and
    responsive to a user input to update the results, discarding the results from the first functional verification analysis and presenting the results from the second functional verification analysis to a user.

6. The computer program product of claim 1, the method further comprising:
    completing the second functional verification analysis, the second functional verification analysis producing a set of results for the second functional verification analysis; and
    responsive to a user input to discard the results, discarding the results from the second functional verification analysis and continuing to present the results from the first functional verification analysis to a user.

7. A computer program product for debugging and verifying a circuit design, the computer program product comprising a computer-readable medium containing computer program code for performing the method comprising:
    receiving a set of results from a first functional verification analysis of a circuit design;

initiating a second functional verification analysis of the circuit design in a background operation;

while performing the second functional verification analysis, receiving a user input for analyzing the results from the first functional verification analysis of the circuit design;

completing the second functional verification analysis, the second functional verification analysis producing a set of results for the second functional verification analysis; and responsive to a user input to update the results, discarding the results from the first functional verification analysis and presenting the results from the second functional verification analysis to a user.

8. The computer program product of claim 7, the method further comprising:

while performing the second functional verification analysis on the circuit design, presenting the set of results from the first functional verification analysis of the circuit design for visualization by a user.

9. The computer program product of claim 7, wherein each functional verification analysis is performed using a set of commands.

10. The computer program product of claim 9, wherein the set of commands includes one or more assumptions for the circuit design for use in the functional verification analysis.

11. The computer program product of claim 9, wherein the set of commands includes a definition of an analysis region in the circuit design in which to perform the functional verification analysis.

12. The computer program product of claim 9, the method further comprising:

during the second functional verification analysis, receiving a user input for defining a new set of commands for a third functional verification analysis of the circuit design.

13. The computer program product of claim 12, the method further comprising:

aborting the second functional verification analysis;

initiating a third functional verification analysis in a background operation.

14. A computer program product for debugging and verifying a circuit design, the computer program product comprising a computer-readable medium containing computer program code for performing the method comprising:

receiving a set of results from a first functional verification analysis of a circuit design;

initiating a second functional verification analysis of the circuit design in a background operation;

while performing the second functional verification analysis, receiving a user input for analyzing the results from the first functional verification analysis of the circuit design;

completing the second functional verification analysis, the second functional verification analysis producing a set of results for the second functional verification analysis; and responsive to a user input to discard the results, discarding the results from the second functional verification analysis and continuing to present the results from the first functional verification analysis to a user.

15. A computer program product for debugging a circuit design, the computer program product comprising a computer-readable medium containing computer program code for performing the method comprising:

receiving a set of results from a previous functional verification of a circuit design;

performing functional verification on the circuit design using a new set of commands that is different from a set of commands used in the previous functional verification;

a step for presenting the results from the previous functional verification while performing functional verification on the circuit design;

receiving a new set of results from the functional verification on the circuit design using the new set of commands;

responsive to a user input, discarding the new set of results; and a step for presenting the set of results from the previous functional verification while performing another functional verification on the circuit design.

16. The computer program product of claim 15, the method further comprising, while performing functional verification on the circuit design:

visualizing the results from the previous functional verification.

17. The computer program product of claim 15, the method further comprising, while performing functional verification on the circuit design:

receiving user input to modify a set of commands for use in a future functional verification of the circuit design.

18. The computer program product of claim 17, the method further comprising:

aborting the functional verification responsive to a user input.

19. The computer program product of claim 18, the method further comprising:

performing functional verification on the circuit design using the modified commands.

20. The computer program product of claim 18, the method further comprising:

tuning the set of commands for a future functional verification; and performing functional verification on the circuit design using the tuned commands.

21. The computer program product of claim 15, the method further comprising:

receiving a new set of results from the functional verification on the circuit design using the new set of commands; and a step for presenting the new set of results while performing another functional verification on the circuit design.

* * * * *